US008040690B2

(12) United States Patent
Wang

(10) Patent No.: US 8,040,690 B2
(45) Date of Patent: Oct. 18, 2011

(54) INNER-CONNECTING STRUCTURE OF LEAD FRAME AND ITS CONNECTING METHOD

(75) Inventor: Chin-Fa Wang, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 360 days.

(21) Appl. No.: 12/341,334

(22) Filed: Dec. 22, 2008

(65) Prior Publication Data

US 2010/0110654 A1    May 6, 2010

(30) Foreign Application Priority Data

Nov. 4, 2008    (TW) ............................... 97142571 A

(51) Int. Cl.
*H05K 1/11* (2006.01)
(52) U.S. Cl. .................. 361/813; 257/666; 174/536
(58) Field of Classification Search .................. 361/723, 361/749, 813; 174/536, 538; 257/666, 675, 257/676
See application file for complete search history.

(56) References Cited

U.S. PATENT DOCUMENTS

| 5,036,380 A | * | 7/1991 | Chase | 257/668 |
| 5,337,216 A | * | 8/1994 | McIver | 361/728 |
| 5,461,202 A | * | 10/1995 | Sera et al. | 174/254 |
| 6,630,732 B2 | * | 10/2003 | Corisis | 257/691 |
| 7,023,315 B2 | * | 4/2006 | Yeo et al. | 336/200 |
| 2005/0142694 A1 | * | 6/2005 | Chiou et al. | 438/109 |

* cited by examiner

*Primary Examiner* — Dameon Levi
(74) *Attorney, Agent, or Firm* — Muncy, Geissler, Olds & Lowe, PLLC

(57) ABSTRACT

An inner-connecting structure of a lead frame. The lead frame includes a metal frame having a plurality of leads. The inner-connecting structure of the lead frame includes an insulation film arranged on some of those leads, covering a portion of a first surface of the lead; a plurality of holes formed on the insulation film to expose some of those leads, wherein the hole exposes a portion of the first surface of the lead; and a conductive element selectively connecting the exposed portion of those leads electrically. Besides, an inner-connecting method of the lead frame is also disclosed herein. The insulation film is utilized to separate the conductive element from the lead frame so that the leads can be easily interconnected with each other.

10 Claims, 2 Drawing Sheets

INNER-CONNECTING STRUCTURE OF LEAD FRAME AND ITS CONNECTING METHOD

BACKGROUND OF THE INVENTION

1. Field of the Invention

The present invention relates to an inner-connecting structure of a lead frame and its connecting method.

2. Description of the Related Art

Owing to high development of semiconductor industry, IC component design for electronic products demand more leads and more functions, whereas in the mean while appearance of components follow the trend to be light, slim, short and small. Therefore, the packaging process faces many challenges, e.g. increasing complexity of lead frame design, selection of packaging material, warping of slim packages, and heat dissipation and structural strength problems.

Furthermore, if a lead frame design requires cross connection between inner leads, large room for inner leads to extend to wire bonding positions is needed, which may be interfered with other leads, causing design difficulties.

SUMMARY OF THE INVENTION

In order to solve abovementioned problem, one objective of the present invention is to facilitate connection and cross-connection between leads by providing a lead frame inner-connecting structure and its connecting method, which interposes an insulation film between the lead frame itself and the conductive element interconnecting leads.

In order to achieve aforementioned objective, one embodiment of the present invention discloses an inner-connecting structure of a lead frame, wherein the lead frame consists of a metal frame comprising a plurality of leads. The inner-connecting structure of the lead frame comprises an insulation film arranged on some of the leads, covering a portion of a first surface of the lead; a plurality of holes formed on the insulation film to expose some of the leads, wherein the hole exposes a portion of the first surface of the lead; and at least one conductive element, selectively connecting the leads exposed from the insulation film electrically.

Another embodiment of the present invention discloses an inner-connecting method for a lead frame, wherein the lead frame consists of a metal frame comprising a plurality leads. The inner-connecting method for the lead frame comprises arranging an insulation film on some of the leads, covering a portion of a first surface of the lead, wherein the insulation film contains a plurality of holes to expose some of the leads, wherein the hole exposes a portion of the first surface of the lead; and forming at least one conductive element to selectively connect the leads exposed from the insulation film electrically.

BRIEF DESCRIPTION OF THE DRAWINGS

The objectives, technical contents and characteristics of the present invention can be more fully understood by reading the following detailed description of the preferred embodiments, with reference made to the accompanying drawings, wherein.

DETAILED DESCRIPTION OF THE INVENTION

Figure 1:
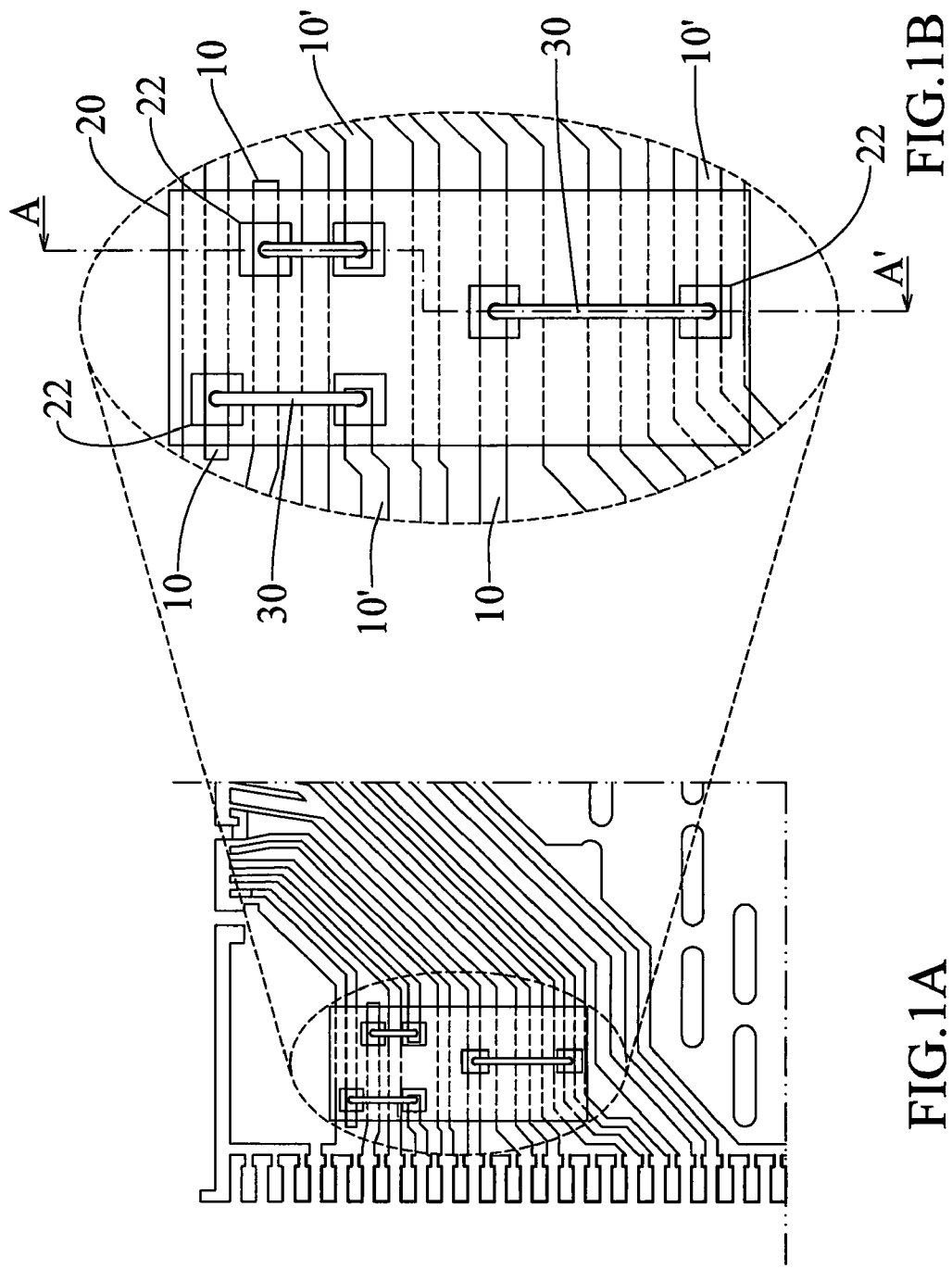
FIG. 1A is a diagram schematically showing a portion of inner leads of a lead frame of an embodiment of the present invention.
FIG. 1B is a diagram showing a zoomed-in portion of FIG. 1A

Please referring to FIG. 1A and FIG. 1B, FIG. 1A schematically shows a portion of inner leads of a lead frame of an embodiment of the present invention, and FIG. 1B shows a zoomed-in portion of FIG. 1A. One embodiment of the present invention is an inner-connecting structure of a lead frame, wherein the lead frame consists of a metal frame comprising a plurality of leads of which length can be different as shown in the figure. The inner-connecting structure of the lead frame comprises an insulation film 20, arranged on some of the leads 10, 10', covering a portion of a first surface of the lead 10, 10', and the lead 10, 10' fixed on the insulating film 20; a plurality of holes 22, formed on the insulation film 20 to expose some of the leads 10, 10', wherein the hole 22 exposes a portion of the first surface of the lead 10, 10' that require electrical connections; and at least one conductive element 30, selectively connecting the leads 10, 10' exposed from the holes 22 of the insulation film 20.

Figure 2:
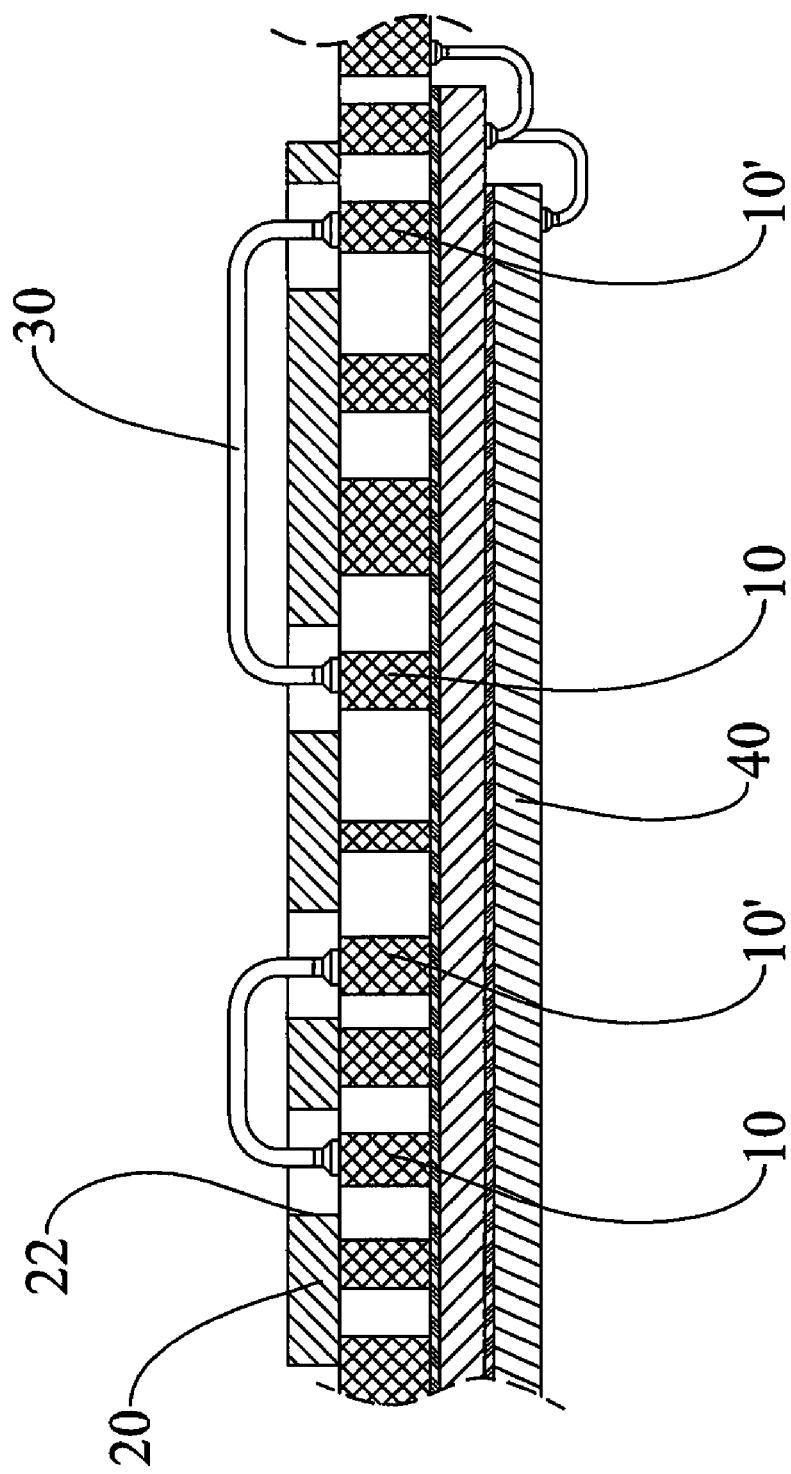
FIG. 2 shows a cross-sectional view of FIG. 1B taken along line AA'.

In continuation of the above illustration, in one embodiment of the present invention, the insulation film 20 includes insulation tape to prevent shortage of leads 10 or 10' and the conductive element 30 for lead interconnection. Besides, with the protection of the insulation film 20, lead design of a lead frame can be simplified. In addition, leads 10, 10' can also be roughly fixed on the insulation film 20 to facilitate later electrical connections. In the present embodiment, conductive element 30 can be metal wires formed by wire bonding to electrically connect leads 10, leads 10'. In another embodiment of the present invention, conductive element 30 can also be conductive adhesives, formed on the insulation film 20 by adequate means to electrically connecting leads that need conduction. On the other hand, in the present embodiment, the first surface in the figure is the lower surface of leads 10, 10', but it is also understood that this structure also can be formed on the upper surface of the leads 10, 10'. In addition, another embodiment of the present invention, as shown in FIG. 2, further includes a chip 40 arranged on the lead frame, and the chip 40 is electrically connected with the leads.

In continuation, an embodiment of the present invention is an inner-connecting method for a lead frame, wherein the lead frame consists of a metal frame comprising a plurality leads. The inner-connecting method for the lead frame includes: arranging an insulation film on some of the leads, covering a portion of a first surface of the lead, wherein the insulation film includes a plurality of holes to expose some of the leads, wherein the hole exposes a portion of the first surface of the lead; forming at least one conductive element to selectively connect the exposed leads from the insulation film electrically, wherein the first surface can the upper or lower surface of the leads.

In continuation of aforementioned illustration, in an embodiment of the present invention, the holes on the insulation film can be created when the insulation film is formed, or it can be created with a hole-punching step after the insulation film is arranged. Besides, in another embodiment of the present invention, the method for forming at least one conductive element can be wire bonding or wire coating, i.e. leads can be interconnected by wire bonding where conductive elements are made of wires, or by wire coating, where conductive elements are made of conductive adhesives formed through the holes on the insulation film. By applying the insulation film, not only shortage produced during wire bonding process can be prevented, but the process is also simplified to prevent errors and increase yields.

In conclusion, the present invention facilitates connection and cross-connection of leads by providing an inner connecting structure of a lead frame and its connecting method, which interposes an insulation film between the lead frame and the conductive element for lead interconnection.

The embodiments described above are to demonstrate the technical contents and characteristics of the preset invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. An inner-connecting structure of a lead frame, wherein said lead frame includes a metal frame having a plurality of leads, comprising:
   an insulation film arranged on some of said leads, covering a portion of a first surface of said leads;
   a plurality of holes formed on said insulation film to expose some of said leads, said hole exposing a portion of said first surface of said leads; and
   at least one conductive element selectively connecting said leads exposed from said insulation film electrically.

2. The inner-connecting structure of the lead frame according to claim 1, wherein said insulation film comprises insulation tape.

3. The inner-connecting structure of the lead frame according to claim 1, wherein said conductive element can be metal wires or conductive adhesives.

4. The inner-connecting structure of the lead frame according to claim 1, wherein length of said leads can be different.

5. The inner-connecting structure of the lead frame according to claim 1, wherein said first surface can be the upper or lower surface of said leads.

6. An inner-connecting method for a lead frame, wherein said lead frame includes a metal frame having a plurality of leads, comprising:
   arranging an insulation film on some of said leads, covering a portion of a first surface of said leads, said insulation film containing a plurality of holes to expose some of said leads, said hole exposing a portion of said first surface of said leads; and
   forming at least one conductive element, to selectively connecting said leads that are exposed from said insulation film electrically.

7. The inner-connecting method for a lead frame according to claim 6, wherein said holes are created together with said insulation film.

8. The inner-connecting method for a lead frame according to claim 6, further comprising a punching step to create said holes on said insulation film following the step to arrange said insulation film.

9. The inner connection method for a lead frame according to claim 6, wherein said first surface can be the upper or lower surface of said leads.

10. The inner connection method for a lead frame according to claim 6, wherein methods for forming said conductive element interconnecting said leads can be wire bonding or wire coating.

* * * * *